United States Patent
Park et al.

(10) Patent No.: US 12,040,814 B2
(45) Date of Patent: Jul. 16, 2024

(54) ANALOG-TO-DIGITAL CONVERTER, METHOD OF ANALOG-TO-DIGITAL CONVERSION, AND ELECTRONIC APPARATUS

(71) Applicants: Samsung Display Co., Ltd., Yongin-si (KR); Korea Advanced Institute of Science and Technology, Daejeon (KR)

(72) Inventors: Kyungtea Park, Seoul (KR); Kun-Woo Park, Daejeon (KR); Jae-Hyun Chung, Daejeon (KR); Ohjo Kwon, Suwon-si (KR); Seung-Tak Ryu, Daejeon (KR); Keumdong Jung, Seoul (KR)

(73) Assignees: SAMSUNG DISPLAY CO., LTD., Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 18/118,918

(22) Filed: Mar. 8, 2023

(65) Prior Publication Data
US 2023/0291413 A1 Sep. 14, 2023

(30) Foreign Application Priority Data
Mar. 10, 2022 (KR) .......... 10-2022-0030305

(51) Int. Cl.
*H03M 1/38* (2006.01)
*G06F 3/01* (2006.01)

(52) U.S. Cl.
CPC .......... *H03M 1/38* (2013.01); *G06F 3/01* (2013.01)

(58) Field of Classification Search
None
See application file for complete search history.

(56) References Cited

U.S. PATENT DOCUMENTS 8,786,483 B1 * 7/2014 Thompson .......... H03M 1/0836
341/161
8,928,515 B1 * 1/2015 Hu .......... H03M 1/10
341/163
(Continued)

FOREIGN PATENT DOCUMENTS

CN 110492885 A * 11/2019 .......... H03M 1/08
CN 116667852 A * 8/2023
(Continued)

OTHER PUBLICATIONS

Hwang, et al., "A 2.7-M Pixels 64-mW CMOS Image Sensor With Multicolumn-Parallel Noise-Shaping SAR ADCs", IEEE Transactions on Electron Devices, vol. 65, No. 3, pp. 1119-1126 Mar. 2018.
(Continued)

*Primary Examiner* — Kenneth Bukowski
(74) *Attorney, Agent, or Firm* — CANTOR COLBURN LLP

(57) ABSTRACT

An analog-to-digital converter includes: a sample/hold circuit, which samples an analog signal, and outputs a first voltage; a digital-to-analog conversion circuit, which converts a digital signal to output a second voltage; an amplifier, which amplifies the first voltage and the second voltage; a noise shaping filter, which integrates a residual voltage corresponding to a difference between the amplified first voltage and the amplified second voltage, and generates a first integration voltage and a second integration voltage; a comparator, which compares a sum of the amplified first voltage, the first integration voltage, and the second integration voltage with the amplified second voltage; and a SAR logic, which outputs the digital signal according to a comparison result of the comparator, and controls the digital-to-analog conversion circuit.

19 Claims, 12 Drawing Sheets

(56) References Cited

U.S. PATENT DOCUMENTS

| | | | | |
|---|---|---|---|---|
| 9,425,818 | B1* | 8/2016 | Rajaee | H03M 3/32 |
| 9,755,657 | B2* | 9/2017 | Baek | H03M 1/466 |
| 11,424,754 | B1* | 8/2022 | Berens | H03M 1/1057 |
| 2010/0066583 | A1* | 3/2010 | Jeon | H03M 1/164 |
| | | | | 341/161 |
| 2019/0131989 | A1* | 5/2019 | Maurino | H03M 3/452 |

FOREIGN PATENT DOCUMENTS

| | | |
|---|---|---|
| KR | 101140349 B1 | 5/2012 |
| KR | 1020160080650 A | 7/2016 |
| KR | 1020190115524 A | 10/2019 |

OTHER PUBLICATIONS

Zhuang, et al. "A Second-Order Noise Shaping SAR ADC With Passive Integrator and Tri-Level Voting", IEEE Journal of Solid-State Circuits, vol. 54, No. 6, pp. 1636-1647 Jun. 2019.

* cited by examiner

ANALOG-TO-DIGITAL CONVERTER, METHOD OF ANALOG-TO-DIGITAL CONVERSION, AND ELECTRONIC APPARATUS

This application claims priority to Korean Patent Application No. 10-2022-0030305 filed on Mar. 10, 2022, and all the benefits accruing therefrom under 35 U.S.C. § 119, the content of which in its entirety is herein incorporated by reference.

BACKGROUND

1. Field

Embodiments relate to an analog-to-digital converter. More particularly, embodiments related to an analog-to-digital converter, a method of analog-to-digital conversion using the same, and an electronic apparatus including the same.

2. Description of the Related Art

An electronic apparatus may include various sensor applications, and accordingly, a sensor for sensing various inputs from the outside may be used. The sensor may include an analog-to-digital converter ("ADC") for converting an analog signal generated by an external input into a digital signal.

If noise of the analog-to-digital converter increases, stability of the analog-to-digital converter decreases, or signal strength in the analog-to-digital converter decreases, the sensor application may not be able to handle the external input correctly.

SUMMARY

Embodiments provide an analog-to-digital converter with improved performance, a method of analog-to-digital conversion using the same, and an electronic apparatus including the same.

An analog-to-digital converter according to embodiments includes: a sample/hold circuit, which samples an analog signal, and outputs a first voltage; a digital-to-analog conversion circuit, which converts a digital signal to output a second voltage; an amplifier, which amplifies the first voltage and the second voltage; a noise shaping filter, which integrates a residual voltage corresponding to a difference between the amplified first voltage and the amplified second voltage, and generates a first integration voltage and a second integration voltage; a comparator, which compares a sum of the amplified first voltage, the first integration voltage, and the second integration voltage with the amplified second voltage; and a successive approximation register ("SAR") logic, which outputs the digital signal according to a comparison result of the comparator, and controls the digital-to-analog conversion circuit.

In an embodiment, the amplifier may be positioned at front ends of the noise shaping filter and the comparator, and may be positioned at back ends of the sample/hold circuit and the digital-to-analog conversion circuit.

In an embodiment, the amplifier may be a pre-amplifier having a gain greater than 1.

In an embodiment, the amplifier may be a buffer having a unit gain.

In an embodiment, the sample/hold circuit may be a passive correlated double sampling ("CDS") circuit including a capacitor and a switch.

In an embodiment, the noise shaping filter may be a passive filter including a capacitor and a switch.

In an embodiment, the capacitor of the noise shaping filter may include a residual capacitor, which samples the residual voltage; a first integration capacitor, which stores the first integration voltage generated by charge sharing with the residual capacitor based on the residual voltage; and a second integration capacitor, which stores the second integration voltage generated by charge sharing with the residual capacitor based on the first integration voltage.

In an embodiment, each of a capacitance of the residual capacitor, a capacitance of the first integration capacitor, and a capacitance of the second integration capacitor may be less than a capacitance of a capacitor included in the digital-to-analog conversion circuit.

In an embodiment, a capacitance of the residual capacitor may be less than each of a capacitance of the first integration capacitor and a capacitance of the second integration capacitor.

In an embodiment, a capacitance of the first integration capacitor may be substantially equal to a capacitance of the second integration capacitor.

In an embodiment, the comparator may amplify the first integration voltage and the second integration voltage, and a gain with respect to the second integration voltage may be greater than a gain with respect to the first integration voltage in the comparator.

A method of analog-to-digital conversion according to embodiments includes: outputting a first voltage by sampling an analog signal, outputting a second voltage by converting a digital signal, amplifying the first voltage and the second voltage, comparing a sum of the amplified first voltage, a first integration voltage, and a second integration voltage with the amplified second voltage, outputting the digital signal according to a comparison result, and generating the first integration voltage and the second integration voltage by integrating a residual voltage corresponding to a difference between the amplified first voltage and the amplified second voltage.

In an embodiment, outputting the second voltage, amplifying the first voltage and the second voltage, comparing the sum of the amplified first voltage, the first integration voltage, and the second integration voltage with the amplified second voltage, and outputting the digital signal may be performed a plurality of times after outputting the first voltage and before generating the first integration voltage and the second integration voltage.

In an embodiment, generating the first integration voltage and the second integration voltage may include sampling the residual voltage, storing the first integration voltage generated by charge sharing based on the residual voltage, and storing the second integration voltage generated by charge sharing based on the first integration voltage.

In an embodiment, storing the second integration voltage may be performed after storing the first integration voltage.

In an embodiment, comparing the sum of the amplified first voltage, the first integration voltage, and the second integration voltage with the amplified second voltage may include amplifying the first integration voltage and the second integration voltage, and a gain with respect to the second integration voltage may be greater than a gain with respect to the first integration voltage.

An electronic apparatus according to embodiments includes: a display device, which displays an image; and a sensor, which senses an external input to the display device, and includes an analog-to-digital converter. The analog-to-digital converter includes: a sample/hold circuit, which samples an analog signal generated by the external input, and outputs a first voltage; a digital-to-analog conversion circuit, which converts a digital signal to output a second voltage; an amplifier, which amplifies the first voltage and the second voltage; a noise shaping filter, which integrates a residual voltage corresponding to a difference between the amplified first voltage and the amplified second voltage, and generates a first integration voltage and a second integration voltage; a comparator, which compares a sum of the amplified first voltage, the first integration voltage, and the second integration voltage with the amplified second voltage; and a SAR logic, which outputs the digital signal according to a comparison result of the comparator, and controls the digital-to-analog conversion circuit.

In an embodiment, the sensor may be at least one of an image sensor and a fingerprint sensor.

In an embodiment, the amplifier may be positioned at front ends of the noise shaping filter and the comparator, and may be positioned at back ends of the sample/hold circuit and the digital-to-analog conversion circuit.

In the analog-to-digital converter, the method of analog-to-digital conversion using the same, and the electronic apparatus including the same according to the embodiments, the amplifier may amplify voltages inputted to the noise shaping filter and the comparator, and may separate the digital-to-analog conversion circuit and the noise shaping filter, so that noise of the analog-to-digital converter may effectively decrease, stability of the analog-to-digital converter may increase, and signal strength in the analog-to-digital converter may not decrease.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
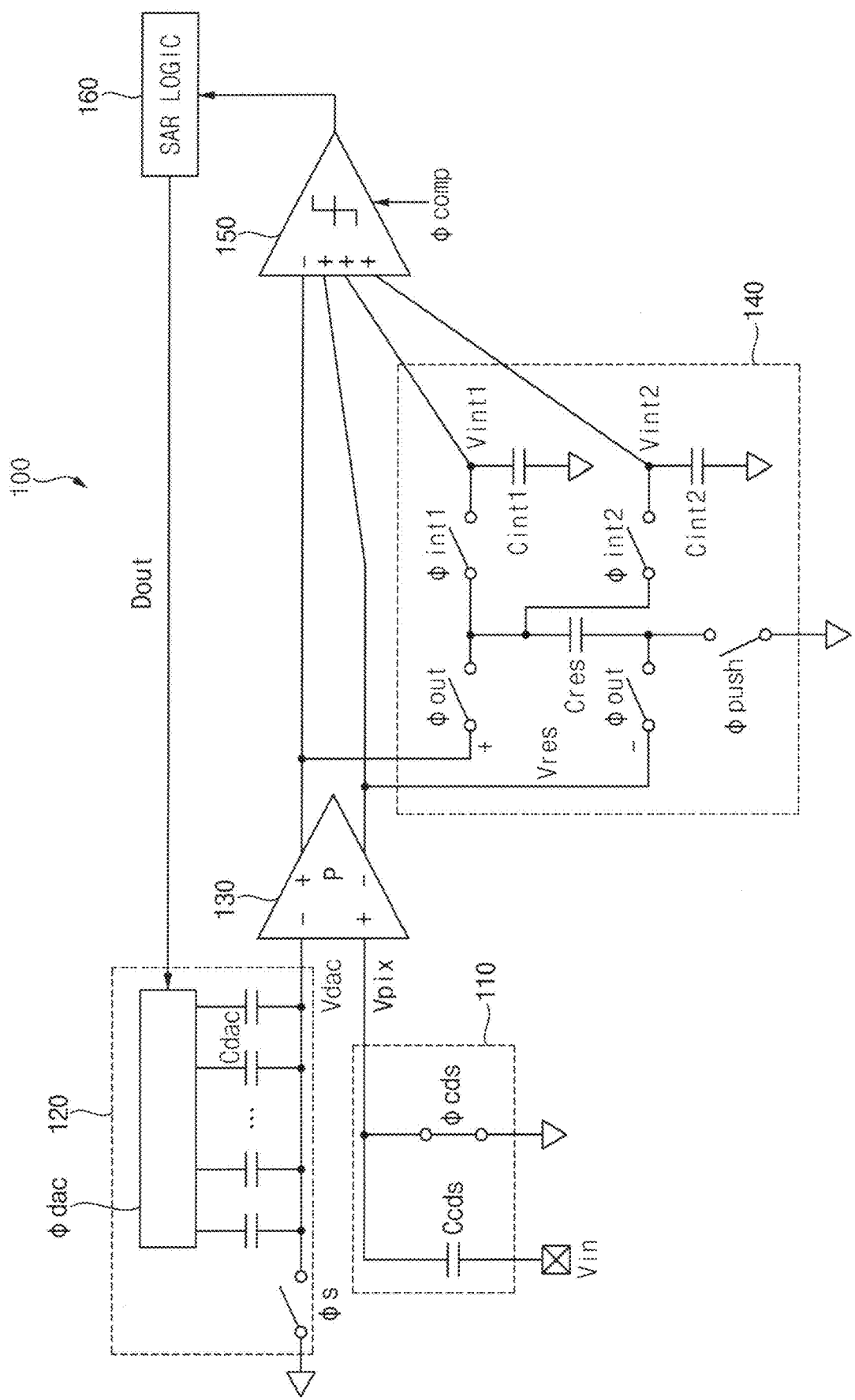
FIG. 1 is a circuit diagram illustrating an analog-to-digital converter according to an embodiment.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About", "substantially" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, an analog-to-digital converter, a method of analog-to-digital conversion, and an electronic apparatus according to embodiments will be described in more detail with reference to the accompanying drawings. The same or similar reference numerals will be used for the same elements in the accompanying drawings.

FIG. 1 is a circuit diagram illustrating an analog-to-digital converter 100 according to an embodiment.

Referring to FIG. 1, the analog-to-digital converter 100 may include a sample/hold circuit 110, a digital-to-analog conversion ("DAC") circuit 120, an amplifier 130, a noise shaping filter 140, a comparator 150, and a successive approximation register ("SAR") logic 160. The analog-to-digital converter 100 may convert an analog signal Vin into a digital signal Dout.

The sample/hold circuit 110 may sample the analog signal Vin, and may output a first voltage Vpix. The sample/hold circuit 110 may receive the analog signal Vin from an external pixel or an analog front end ("AFE").

In an embodiment, the sample/hold circuit 110 may be a passive correlated double sampling ("CDS") circuit including a capacitor and a switch. For example, the sample/hold circuit 110 may include a CDS capacitor Ccds and a CDS switch Φcds. A first terminal of the CDS capacitor Ccds may receive the analog signal Vin, and a second terminal of the CDS capacitor Ccds may be connected to the amplifier 130. A first terminal of the CDS switch Φcds may be connected to an alternating current ("AC") ground, and a second terminal of the CDS switch Φcds may be connected to the second terminal of the CDS capacitor Ccds and the amplifier 130. When the sample/hold circuit 110 is the passive CDS circuit, power consumption of the analog-to-digital converter 100 may decrease.

The DAC circuit 120 may convert the digital signal Dout, and may output the second voltage Vdac. The DAC circuit 120 may receive the digital signal Dout from the SAR logic 160, and may convert the digital signal Dout into the second voltage Vdac that is an analog signal.

The DAC circuit 120 may include a plurality of DAC capacitors Cdac, a plurality of DAC switches Φdac, and a ground switch Φs. First terminals of the DAC capacitors Cdac may be connected to the DAC switches Φdac, and second terminals of the DAC capacitors Cdac may be connected to the amplifier 130 and the ground switch Φs. In an embodiment, the number of DAC capacitors Cdac may be equal to the number of bits of the digital signal Dout.

The amplifier 130 may amplify the first voltage Vpix and the second voltage Vdac. As the amplifier 130 amplifies the first voltage Vpix and the second voltage Vdac, noise generated by capacitors Cres, Cint1, and Cint2 of the noise shaping filter 140 may be relatively small, and accordingly, noise performance of the analog-to-digital converter 100 may be improved. Further, as the amplifier 130 amplifies the first voltage Vpix, decrease of the first voltage Vpix due to charge sharing of the noise shaping filter 140 may be effectively prevented.

The amplifier 130 may be positioned at a front end of the noise shaping filter 140 and the comparator 150, and may be positioned at a back end of the sample/hold circuit 110 and the DAC circuit 120. In other words, input terminals of the amplifier 130 may be connected to the sample/hold circuit 110 and the DAC circuit 120, and output terminals of the amplifier 130 may be connected to the noise shaping filter 140 and the comparator 150.

As the amplifier 130 is positioned between the DAC circuit 120 and the noise shaping filter 140 (e.g., the DAC circuit 120 is connected to an input terminal of the amplifier 130, and the noise shaping filter 140 is connected to an output terminal of the amplifier 130), the amplifier 130 may separate the DAC capacitors Cdac of the DAC circuit 120 from the capacitors Cres, Cint1, and Cint2 of the noise shaping filter 140. Accordingly, a size of the DAC capacitor Cdac of the DAC circuit 120 may not affect the noise shaping filter 140, and sizes of the capacitors Cres, Cint1 and Cint2 of the noise shaping filter 140 may be flexibly set.

As the amplifier is positioned at the front end of the noise shaping filter 140, the amplifier 130 may fix a common mode voltage of a first integration voltage Vint1 and a second integration voltage Vint2, which are outputted from the noise shaping filter 140 and inputted to the comparator 150, to an AC ground voltage. Further, as the amplifier 130 is positioned at the front end of the comparator 150, the amplifier 130 may fix a common mode voltage of an amplified first integration voltage Vint1 and an amplified second integration voltage Vint2, which are inputted to the comparator 150, to the AC ground voltage. Accordingly, the amplifier 130 may maintain the common mode voltage of the voltages inputted to the comparator 150 to be equal, so that the comparator 150 may normally operate, and a relative gain between the voltages inputted to the comparator 150 may not be generated.

In an embodiment, the amplifier 130 may be a preamplifier having a gain P greater than 1. Accordingly, a magnitude of each of the first voltage Vpix and the second voltage Vdac outputted from the amplifier 130 may increase.

The noise shaping filter 140 may integrate a residual voltage Vres corresponding to a difference between the amplified first voltage Vpix and the amplified second voltage Vdac, and may generate the first integration voltage Vint1 and the second integration voltage Vint2. The noise shaping filter 140 may serve to reduce quantization noise of the digital signal Dout.

In an embodiment, the noise shaping filter 140 may be a passive filter including a capacitor and a switch. For example, the noise shaping filter 140 may include a residual capacitor Cres, an output switch Φout, a first integration capacitor Cint1, a first integration switch Φint1, a second integration capacitor Cint2, a second integration switch Φint2, and a push switch Φpush. The residual capacitor Cres may sample the residual voltage Vres. The output switch Φout may selectively connect a first terminal of the residual capacitor Cres to the output terminal of the amplifier 130 that outputs the amplified second voltage Vdac, and may selectively connect a second terminal of the residual capacitor Cres to the output terminal of the amplifier 130 that outputs the amplified first voltage Vpix. The first integration capacitor Cint1 may store the first integration voltage Vint1 generated by charge sharing with the residual capacitor Cres based on the residual voltage Vres. The first integration switch Φint1 may selectively connect a first terminal of the first integration capacitor Cint1 to the first terminal of the residual capacitor Cres. The second integration capacitor Cint2 may store the second integration voltage Vint2 generated by charge sharing with the residual capacitor Cres based on the first integration voltage Vint1. The second integration switch Φint2 may selectively connect a first terminal of the second integration capacitor Cint2 to the first terminal of the residual capacitor Cres. The push switch Φpush may selectively connect the second terminal of the residual capacitor Cres to the AC ground. When the noise shaping filter 140 is the passive filter, power consumption of the analog-to-digital converter 100 may decrease. Further, as the quantization noise of the digital signal Dout is reduced by the noise shaping filter 140, resolution of the data signal Dout (e.g., the number of voltage levels of the analog signal Vin which can be represented by the data signal Dout) outputted from the analog-to-digital converter 100 may increase.

In an embodiment, each of a capacitance of the residual capacitor Cres, a capacitance of the first integration capacitor Cint1, and a capacitance of the second integration capacitor Cint2 may be less than a capacitance of the DAC capacitor Cdac included in the DAC circuit 120. As described above, as the size of the DAC capacitor Cdac of the DAC circuit 120 does not affect the noise shaping filter 140, the sizes of the capacitors Cres, Cint1, and Cint2 of the noise shaping filter 140 may be flexibly set regardless the size of the DAC capacitor Cdac of the DAC circuit 120. Further, as the capacitances of the capacitors Cres, Cint1, and Cint2 of the noise shaping filter 140 are relatively small, power consumption and size of the analog-to-digital converter 100 may decrease.

In an embodiment, the capacitance of the residual capacitor Cres may be less than each of the capacitance of the first integration capacitor Cint1 and the capacitance of the second integration capacitor Cint2. Further, the capacitance of the first integration capacitor Cint1 may be substantially equal to the capacitance of the second integration capacitor Cint2. For example, the capacitance of the residual capacitor Cres may be half of the capacitance of the first integration capacitor Cint1.

The comparator 150 may compare a sum of the amplified first voltage Vpix, the first integration voltage Vint1, and the second integration voltage Vint2 with the amplified second voltage Vdac, and may output a comparison result.

The comparator 150 may amplify the first integration voltage Vint1 and the second integration voltage Vint2. In an embodiment, a gain with respect to the second integration voltage Vint2 may be greater than a gain with respect to the first integration voltage Vint1. For example, the gain with respect to the first integration voltage Vint1 may be 4/3, and the gain with respect to the second integration voltage Vint2 may be 4. By adjusting sizes of transistors of the comparator 150 connected to input terminals of the comparator 150, the gain with respect to the first integration voltage Vint1 and the gain with respect to the second integration voltage Vint2 may be set.

The SAR logic 160 may output the digital signal Dout according to the comparison result of the comparator 150. The SAR logic 160 may control the DAC circuit 120. For example, the SAR logic 160 may control the DAC switches Φdac of the DAC circuit 120.

Figure 2:
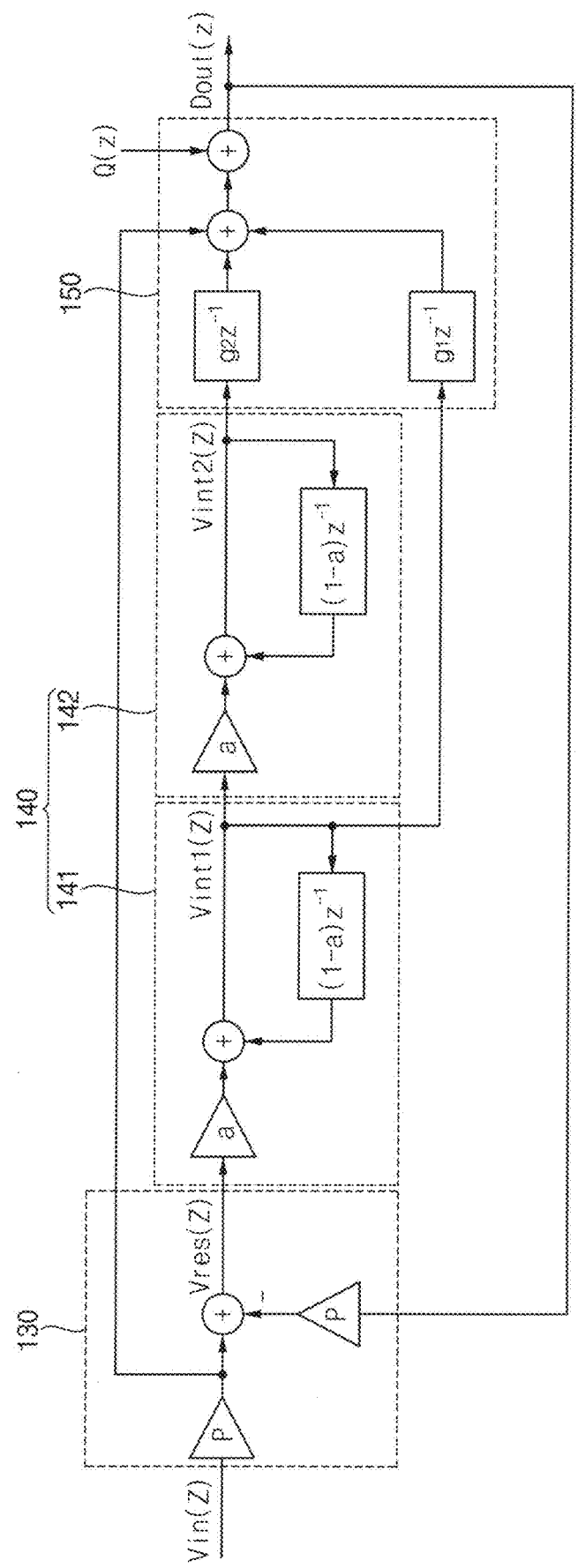
FIG. 2 is a z-domain block diagram of the analog-to-digital converter in FIG. 1.

FIG. 2 is a z-domain block diagram of the analog-to-digital converter 100 in FIG. 1.

Referring to FIGS. 1 and 2, the noise shaping filter 140 may include a first integrator 141 and a second integrator 142. The first integrator 141 may be formed of the residual capacitor Cres and the first integration capacitor Cint1, and the second integrator 142 may be formed of the residual capacitor Cres and the second integration capacitor Cint2.

An attenuation coefficient a may be a value obtained by dividing the capacitance of the residual capacitor Cres by a sum of the capacitance of the first integration capacitor Cint1 and the capacitance of the residual capacitor Cres. For example, when the capacitance of the residual capacitor Cres is half of the capacitance of the first integration capacitor Cint1, the attenuation coefficient a may be ⅓. Further, a gain P of the amplifier 130 may be 1.5, and the gain g1 with respect to the first integration voltage Vint1 and the gain g2 with respect to the second integration voltage Vint2 may be 4/3 and 4, respectively. In this case, a relationship between the analog signal Vin inputted to the analog-to-digital converter 100 and the digital signal Dout outputted from the analog-to-digital converter 100 may be expressed as Equation 1 below.

$$Dout(z)=Vin(z)+[½*Vin(z)+Q(z)]*[1-0.67z^{-1}]^2 \quad \text{[Equation 1]}$$

As illustrated in Equation 1, the quantization noise Q may be subjected to secondary noise shaping by the noise shaping filter 140. A condition for stabilizing the analog-to-digital converter 100 may be expressed as Equation 2 below.

$$[(2-a)/a]*g1+g2<1/p*[(2-a)/a]^2 \quad \text{[Equation 2]}$$

In order to derive the digital signal Dout of Equation 1 and satisfy the stabilization condition of Equation 2, the sizes of the transistors of the comparator 150, which are connected to the input terminals of the comparator 150, may be determined such that the gain g1 with respect to the first integration voltage Vint1 and the gain g2 with respect to the second integration voltage Vint2 may be set to 4/3 and 4, respectively.

Figure 3:
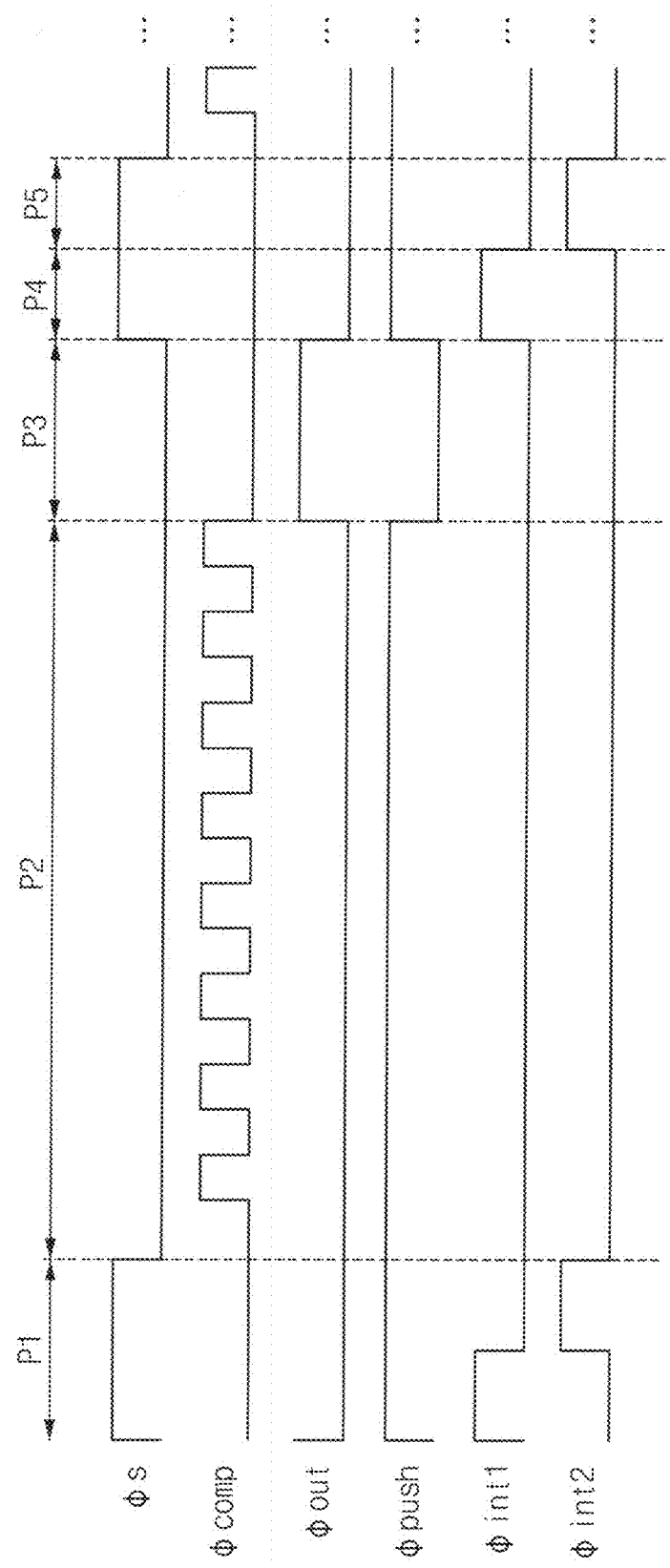
FIG. 3 is a timing diagram for describing an operation of the analog-to-digital converter in FIG. 1.
Figure 4:
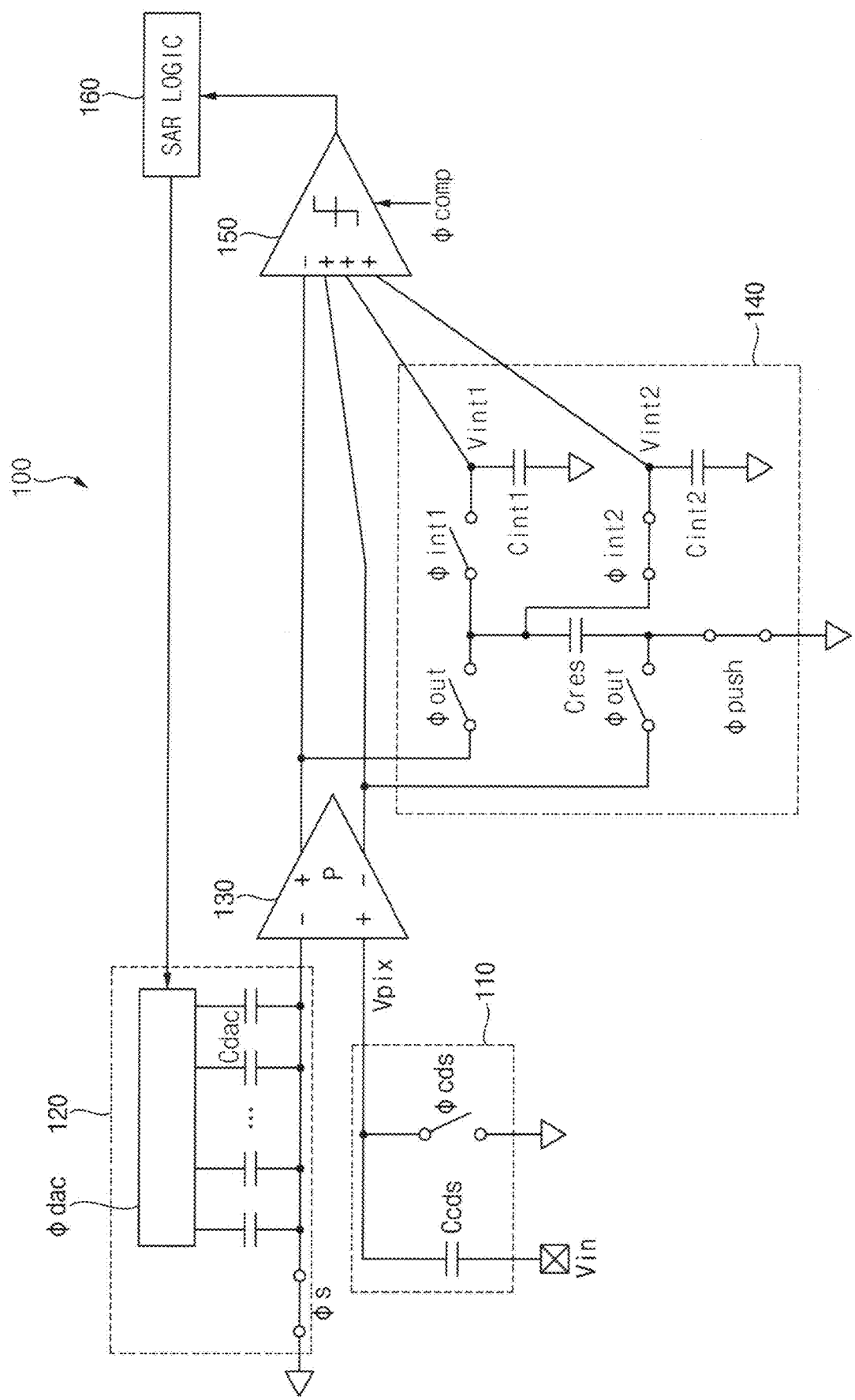
FIG. 4 is a diagram for describing an analog signal sampling of the analog-to-digital converter in FIG. 1.
Figure 5:
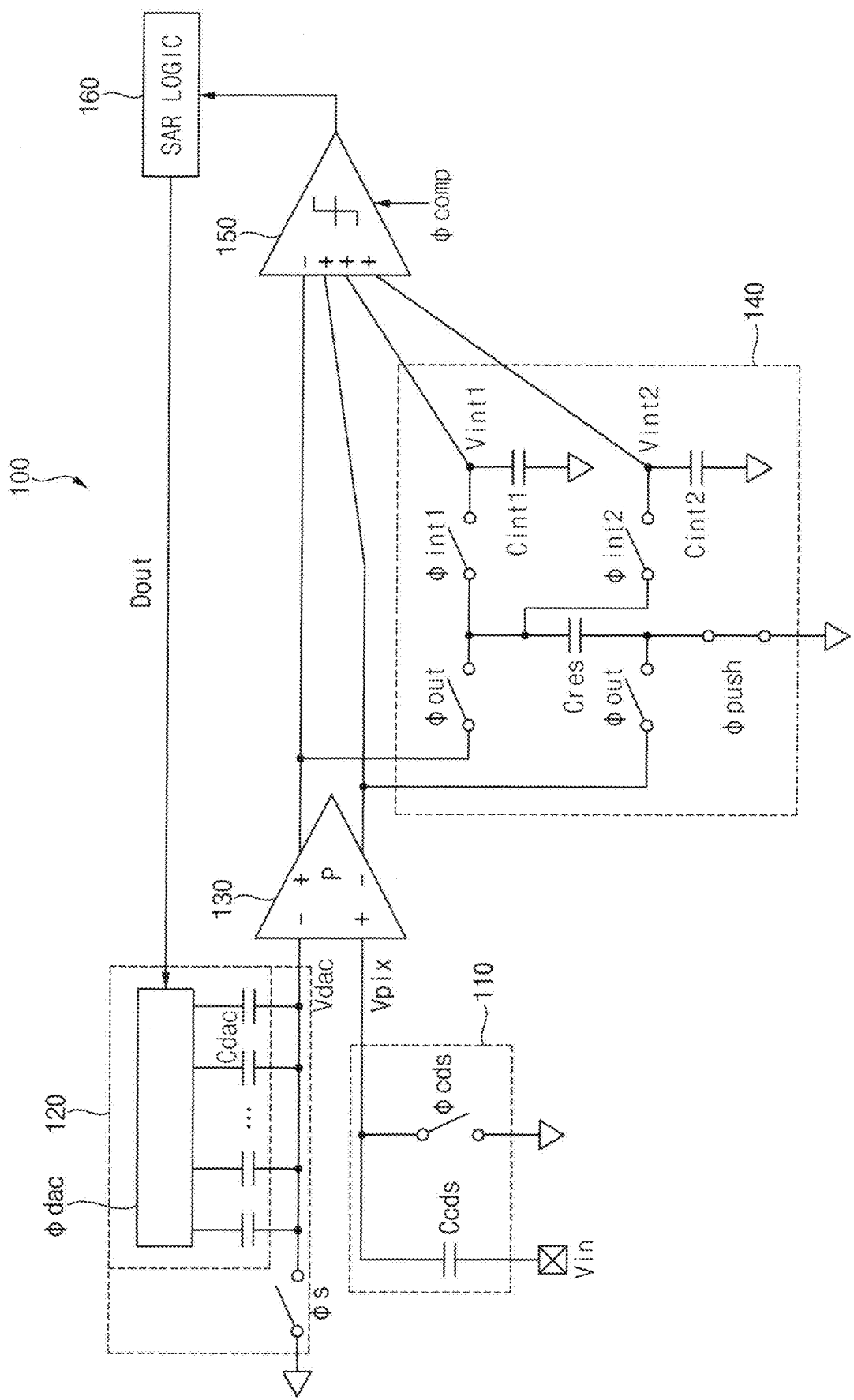
FIG. 5 is a diagram for describing a signal conversion of the analog-to-digital converter in FIG. 1.
Figure 6:
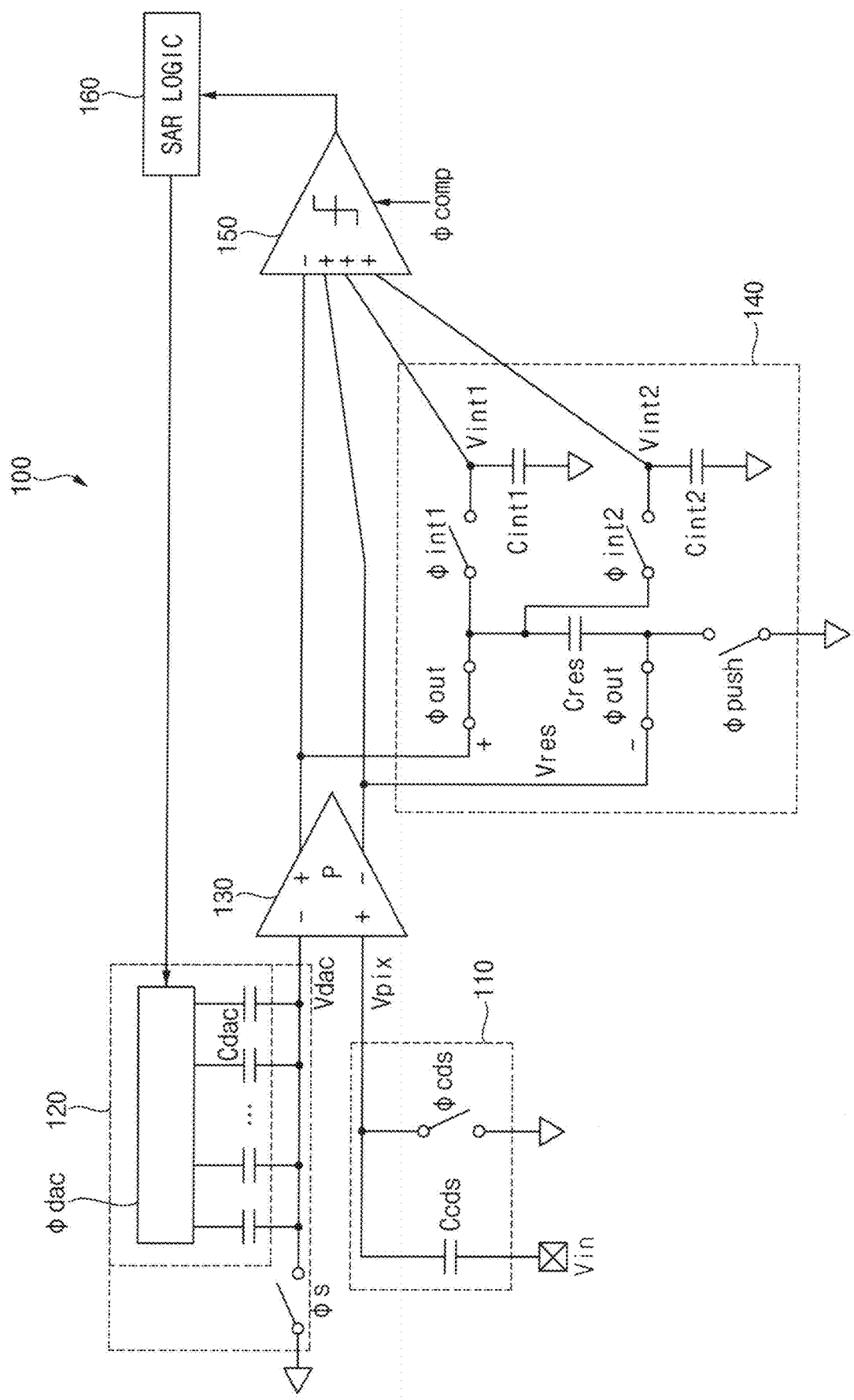
FIG. 6 is a diagram for describing a residual voltage sampling of the analog-to-digital converter in FIG. 1.
Figure 7:
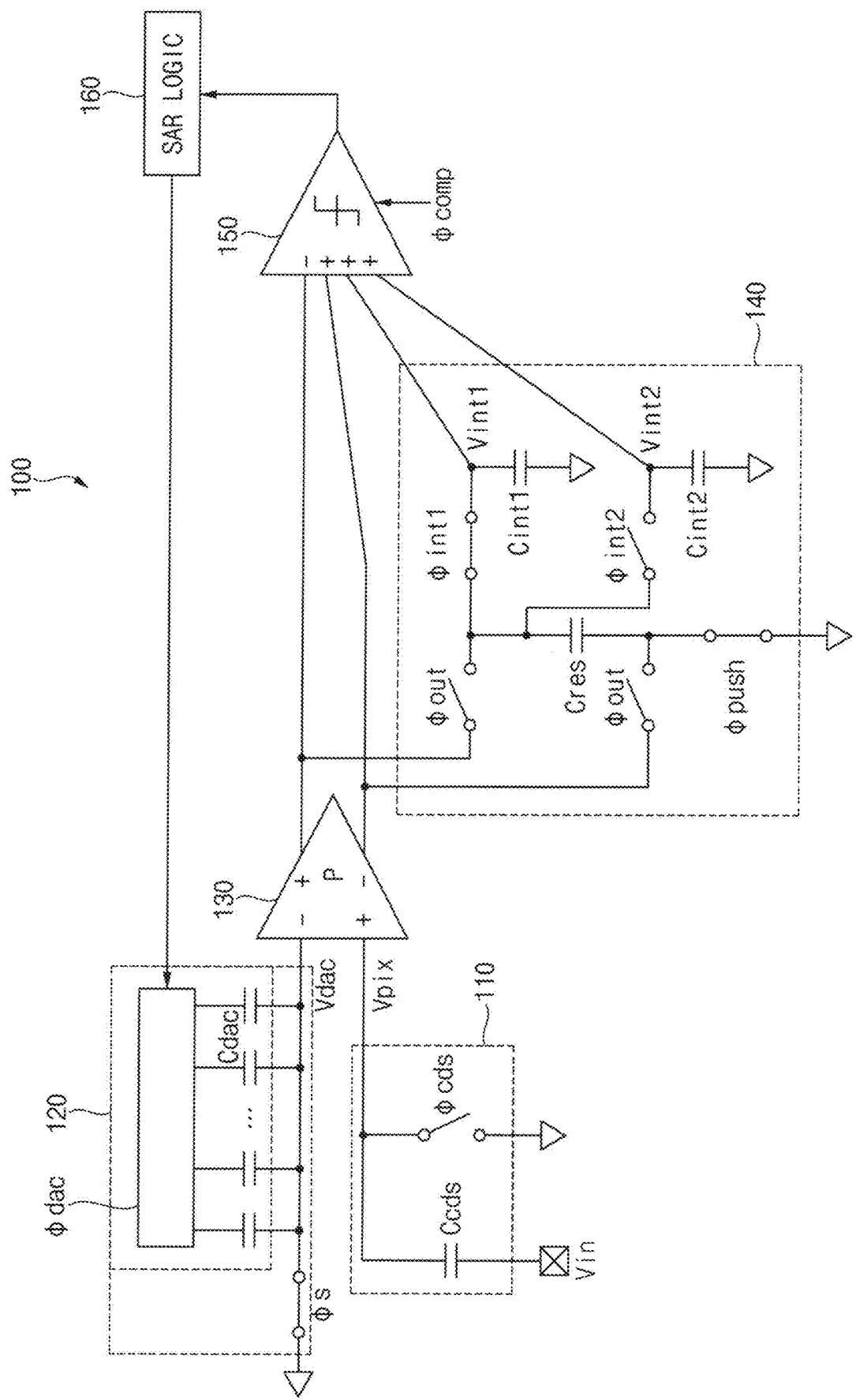
FIG. 7 is a diagram for describing a first integration of the analog-to-digital converter in FIG. 1.
Figure 8:
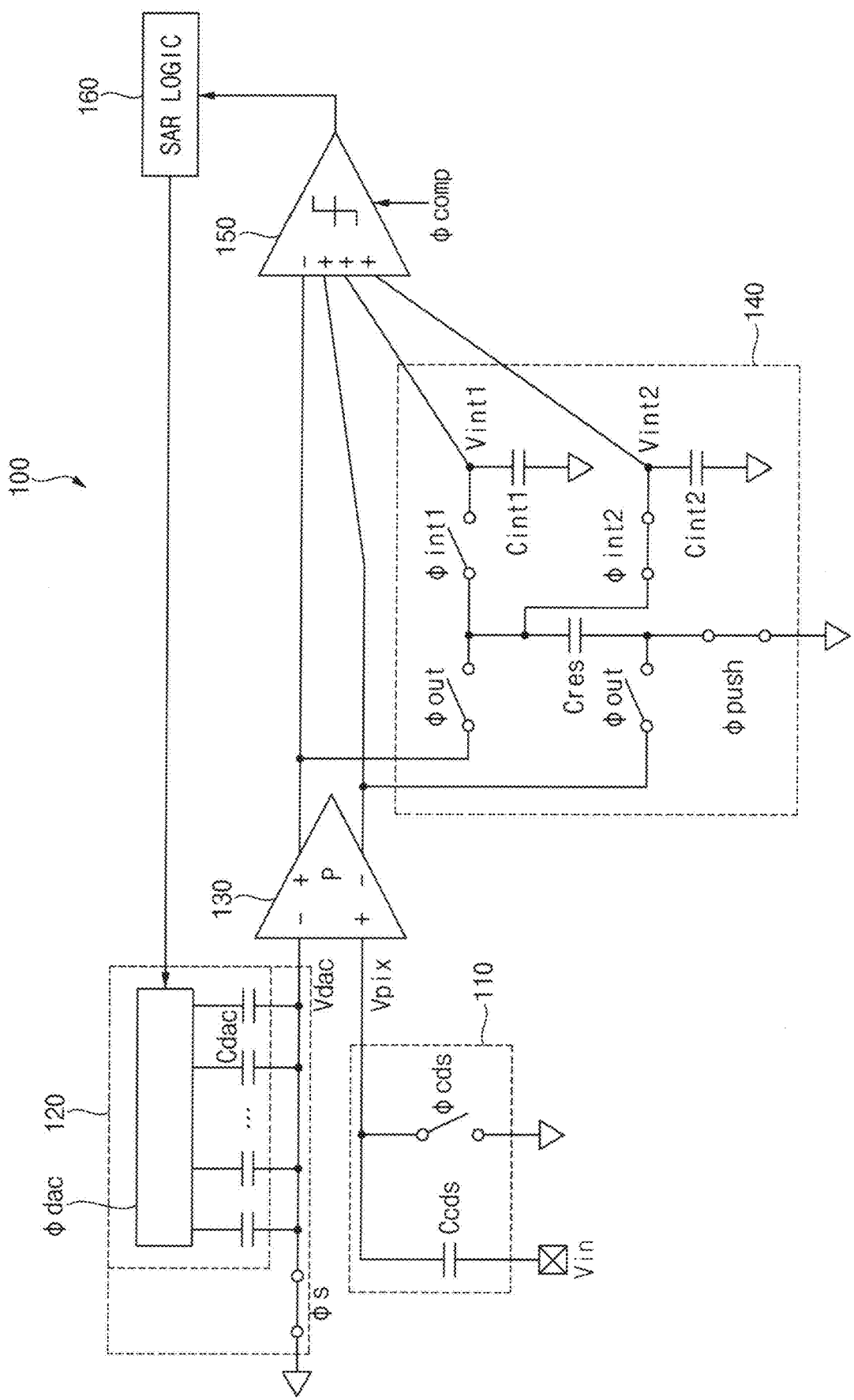
FIG. 8 is a diagram for describing a second integration of the analog-to-digital converter in FIG. 1.

FIG. 3 is a timing diagram for describing an operation of the analog-to-digital converter 100 in FIG. 1. FIG. 4 is a diagram for describing an analog signal sampling of the analog-to-digital converter 100 in FIG. 1. FIG. 5 is a diagram for describing a signal conversion of the analog-to-digital converter 100 in FIG. 1. FIG. 6 is a diagram for describing a residual voltage sampling of the analog-to-digital converter 100 in FIG. 1. FIG. 7 is a diagram for describing a first integration of the analog-to-digital converter 100 in FIG. 1. FIG. 8 is a diagram for describing a second integration of the analog-to-digital converter 100 in FIG. 1.

Referring to FIGS. 3 and 4, in a first period P1, the sample/hold circuit 110 may sample the analog signal Vin. In the first period P1, the CDS switch Φcds may be turned off, and the ground switch Φs may be turned on. Accordingly, in the first period P1, the CDS capacitor Ccds may sample the analog signal Vin to output the first voltage Vpix, and the DAC capacitors Cdac may sample the AC ground voltage.

Referring to FIGS. 3 and 5, in a second period P2, the analog-to-digital converter 100 may convert the analog signal Vin into the digital signal Dout. In the second period P2, the comparator 150 may compare input voltages Vpix, Vint1, Vint2, and Vdac N times (N is a natural number greater than 1), and the analog-to-digital converter 100 may convert the analog signal Vin into the digital signal Dout N times. For example, in the second period P2, when the digital signal Dout has 8 bits, the comparator 150 may compare the input voltages Vpix, Vint1, Vint2, and Vdac eight times.

Referring to FIGS. 3 and 6, in a third period P3, the noise shaping filter 140 may sample the residual voltage Vres after conversion of the analog signal Vin. In the third period P3, the output switch Φout may be turned on, and the push switch Φpush may be turned off. Accordingly, in the third period P3, the residual capacitor Cres may sample the residual voltage Vres.

Referring to FIGS. 3 and 7, in a fourth period P4, the noise shaping filter 140 may first-integrate the residual voltage Vres, and the first integration capacitor Cint1 may store the first integration voltage Vint1 generated by charge sharing based on the residual voltage Vres. In the fourth period P4, the output switch Φout and the second integration switch Φint2 may be turned off, and the push switch Φpush and the first integration switch Φint1 may be turned on. Accordingly, in the fourth period P4, the first integration voltage Vint1 may be generated by charge sharing between the residual capacitor Cres and the first integration capacitor Cint1. The first integration voltage Vint1 may be expressed as Equation 3 below.

$$Vint1[n]=a*Vres[n]+(1-a)*Vint1[n-1] \quad \text{[Equation 3]}$$

In Equation 3, Vint1 [n] represents the current first integration voltage, a represents the attenuation coefficient, Vres[n] represents the current residual voltage, and Vint1[n−1] represents the previous first integration voltage.

Referring to FIGS. 3 and 8, in a fifth period P5, the noise shaping filter 140 may second-integrate the residual voltage Vres, and the second integration capacitor Cint2 may store the second integration voltage Vint2 generated by charge sharing based on the first integration voltage Vint1. In the fifth period P5, the output switch Φout and the first integration switch Φint1 may be turned off, and the push switch Φpush and the second integration switch Φint2 may be turned on. Accordingly, in the fifth period P5, the second integration voltage Vint2 may be generated by charge sharing between the residual capacitor Cres and the second integration capacitor Cint2. The second integration voltage Vint2 may be expressed as Equation 4 below.

$$Vint2[n]=a*Vint1[n]+(1-a)*Vint2[n-1] \quad \text{[Equation 4]}$$

In Equation 4, Vint2[n] represents the current second integration voltage, a represents the attenuation coefficient, Vint1 [n] represents the current first integration voltage, and Vint2[n−1] represents the previous second integration voltage.

The first period P1 may be the same period as the fourth and fifth periods P4 and P5. In other words, the first period P1 may include the fourth period P4 and the fifth period P5. Accordingly, in the first period P1, in which the sample/hold circuit 110 samples the analog signal Vin, the first integration of the residual voltage Vres in the fourth period P4 and the second integration of the residual voltage Vres in the fifth period P5 may be sequentially performed.

Figure 9:
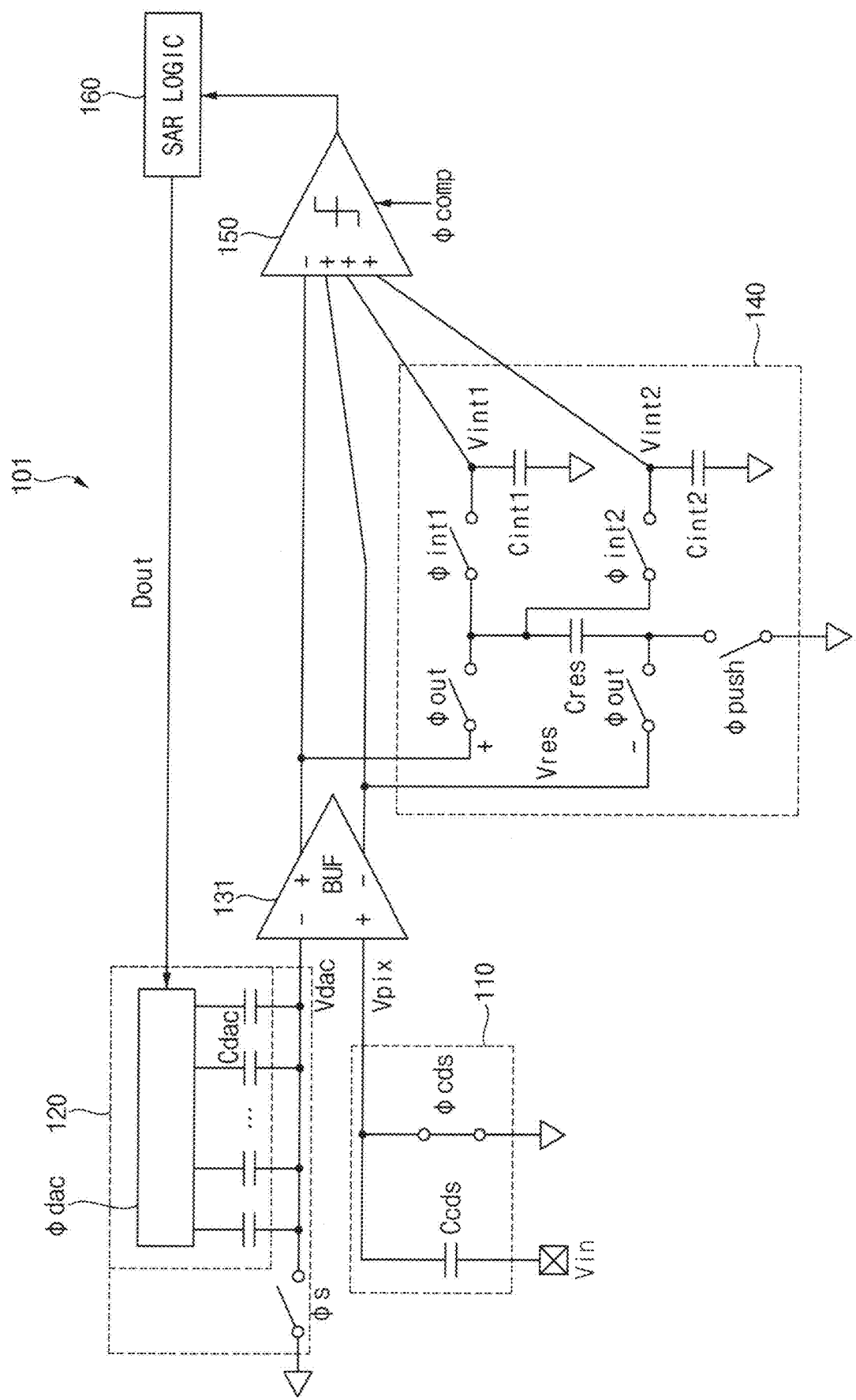
FIG. 9 is a circuit diagram illustrating an analog-to-digital converter according to another embodiment.

FIG. 9 is a circuit diagram illustrating an analog-to-digital converter 101 according to another embodiment.

Referring to FIG. 9, the analog-to-digital converter 101 may include a sample/hold circuit 110, a DAC circuit 120, an amplifier 131, a noise shaping filter 140, a comparator 150, and a SAR Logic 160. The analog-to-digital converter 101 described with reference to FIG. 9 may be substantially the same as or similar to the analog-to-digital converter 100 described with reference to FIG. 1 except for the amplifier 131. Accordingly, descriptions of the overlapping components will be omitted.

In an embodiment, the amplifier 131 may be a buffer having a unit gain. Accordingly, while the analog signal Vin is converted into the digital signal Dout, the magnitude of the first voltage Vpix and the magnitude of the second voltage Vdac may maintain, and the magnitude of the first voltage Vpix and the magnitude of the second voltage Vdac may not decrease.

Figure 10:
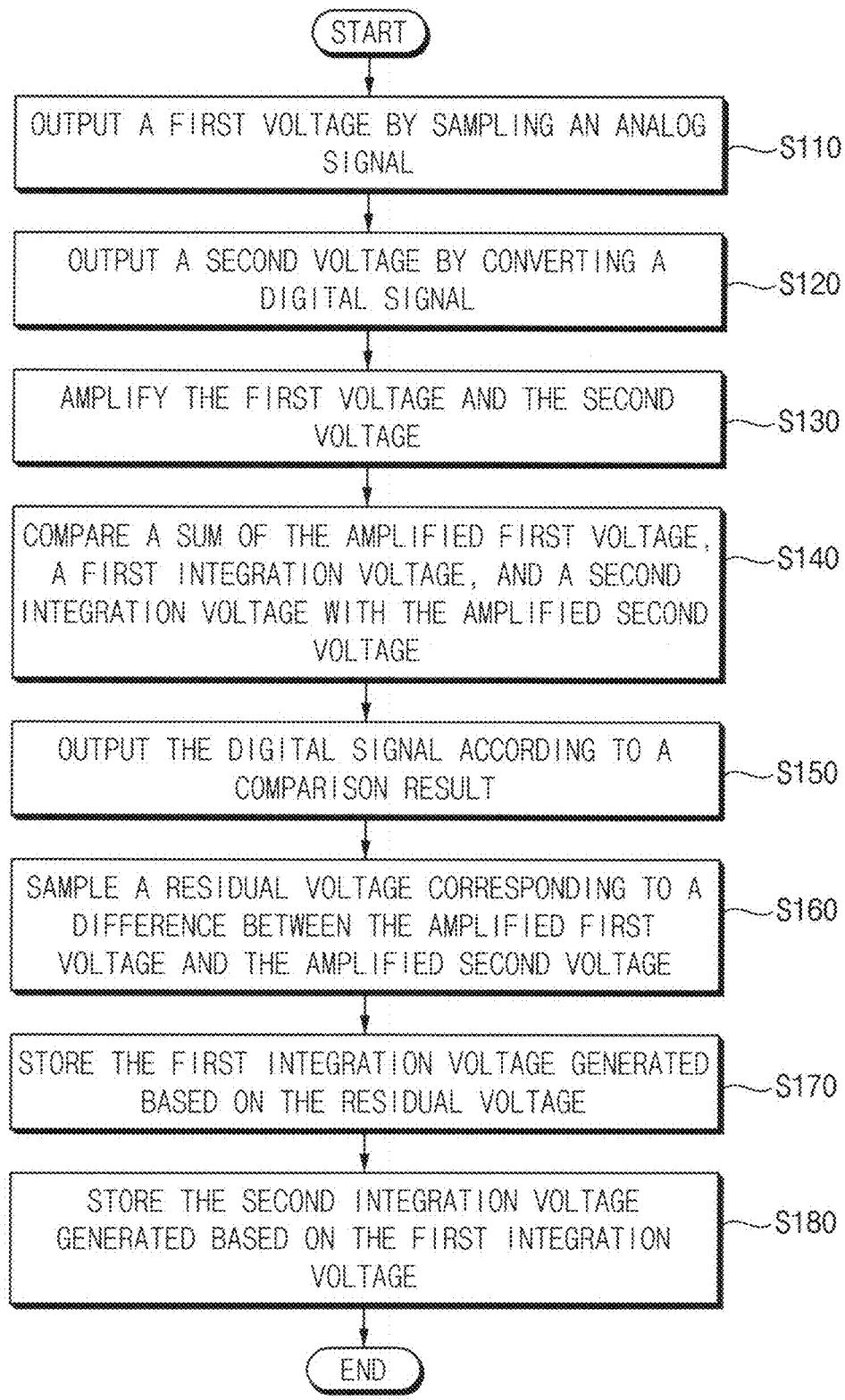
FIG. 10 is a flowchart illustrating a method of analog-to-digital conversion according to an embodiment.

FIG. 10 is a flowchart illustrating a method of analog-to-digital conversion according to an embodiment.

Referring to FIG. 10, first, an analog signal Vin may be sampled to output a first voltage Vpix (S110).

Then, a digital signal Dout may be converted to output a second voltage Vdac (S120), the first voltage Vpix and the second voltage Vdac may be amplified (S130), a sum of the amplified the first voltage Vpix, a first integration voltage Vint1, and a second integration voltage Vint2 may be compared with the amplified second voltage Vdac (S140), and the digital signal Dout may be outputted according to a comparison result (S150). The outputting of the second voltage Vdac (S120), the amplification of the first voltage Vpix and the second voltage Vdac (S130), the comparison of the sum of the amplified first voltage Vpix, the first integration voltage Vint1, and the second integration voltages Vint2 with the amplified second voltage Vdac (S140), and the outputting of the digital signal Dout (S150) may be performed a plurality of times.

In the process of comparing the sum of the amplified first voltage Vpix, the first integration voltage Vint1, and the second integration voltage Vint2 with the amplified second voltage Vdac (S140), the first integration voltage Vint1 and the second integration voltage Vint2 may be amplified. In an embodiment, a gain with respect to the second integration voltage Vint2 may be greater than a gain with respect to the first integration voltage Vint1.

Then, a residual voltage Vres corresponding to a difference between the amplified first voltage Vpix and the amplified second voltage Vdac may be sampled (S160), the first integration voltage Vint1 generated by charge sharing based on the residual voltage Vres may be stored (S170), and the second integration voltage Vint2 generated by charge sharing based on the first integration voltage Vint1 may be stored (S180). The storage of the second integration voltage Vint2 (S180) may be performed after the storage of the first integration voltage Vint1 (S170).

Figure 11:
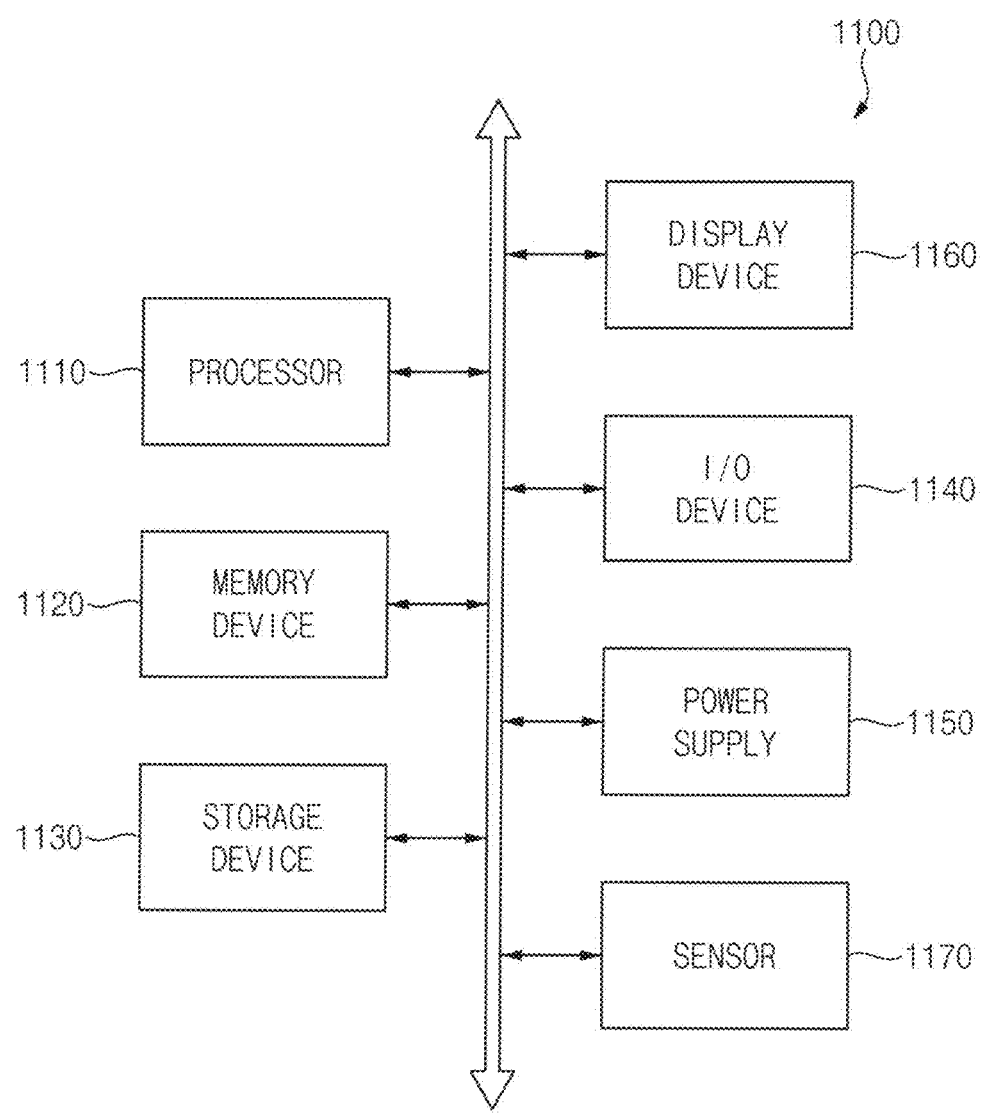
FIG. 11 is a block diagram illustrating an electronic apparatus according to an embodiment.
Figure 12:
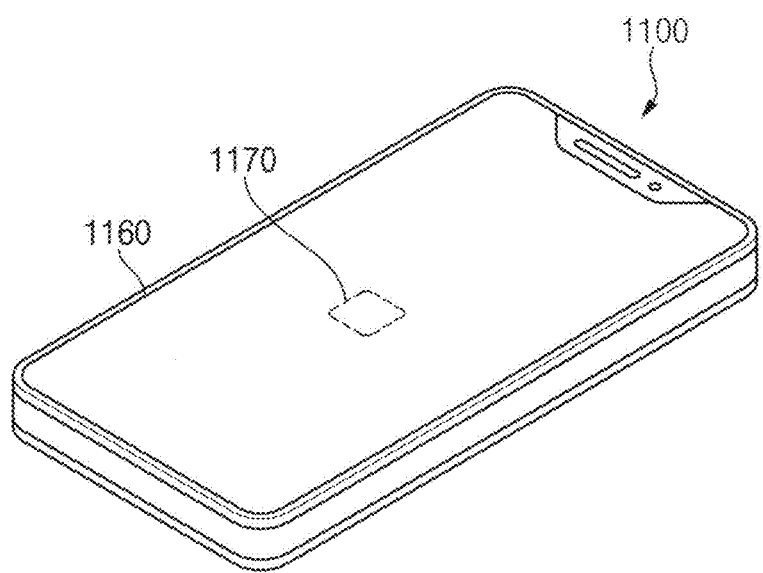
FIG. 12 is a perspective view illustrating an example of the electronic apparatus in FIG. 11.

FIG. 11 is a block diagram illustrating an electronic apparatus 1100 according to an embodiment. FIG. 12 is a perspective view illustrating an example of the electronic apparatus 1100 in FIG. 11.

Referring to FIGS. 11 and 12, the electronic apparatus 1100 may include a processor 1110, a memory device 1120, a storage device 1130, an input/output ("I/O") device 1140, a power supply 1150, a display device 1160, and a sensor 1170. The electronic apparatus 1100 may further include a plurality of ports for communicating with a video card, a sound card, a memory card, a universal serial bus ("USB") device, etc.

In an embodiment, as illustrated in FIG. 12, the electronic apparatus 1100 may be implemented as a smartphone. However, the present disclosure is not limited thereto, and the electronic apparatus 1100 may be implemented as a mobile phone, a video phone, a smart pad, a monitor, a television, a smart watch, a tablet PC, a vehicle navigation system, a notebook computer, a head mounted display ("HMD"), or the like.

The processor 1110 may perform particular calculations or tasks. In an embodiment, the processor 1110 may be a microprocessor, a central processing unit ("CPU"), or the like. The processor 1110 may be coupled to other components via an address bus, a control bus, a data bus, or the like. In an embodiment, the processor 1110 may be coupled to an extended bus such as a peripheral component interconnection ("PCI") bus.

The memory device 1120 may store data for operations of the electronic apparatus 1100. In an embodiment, the memory device 1120 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc.

The storage device 1130 may include a solid-state drive ("SSD") device, a hard disk drive ("HDD") device, a CD-ROM device, or the like. The I/O device 1140 may include an input device such as a keyboard, a keypad, a touchpad, a touch-screen, a mouse device, etc., and an output device such as a speaker, a printer, etc. The power supply 1150 may supply power for the operation of the electronic apparatus 1100.

The display device 1160 may display an image. The display device 1160 may be coupled to other components via the buses or other communication links.

The sensor 1170 may detect an external input to the display device 1160. The sensor 1170 may be disposed under the display device 1160, or may be built in the display device 1160.

In an embodiment, the sensor 1170 may be at least one of an image sensor and a fingerprint sensor. However, the present disclosure is not limited thereto, and the sensor 1170 may be at least one of a temperature sensor, a humidity sensor, an ultrasonic sensor, an acceleration sensor, and a biosensor in another embodiment.

The sensor 1170 may include an analog-to-digital converter that converts a voltage generated in a pixel according to the external input or converts a voltage generated by an analog front end based on a current generated in a pixel according to the external input. The analog-to-digital converter may be any one of the analog-to-digital converter 100 illustrated in FIG. 1 and the analog-to-digital converter 101 illustrated in FIG. 9.

As used in connection with various embodiments of the disclosure, the term "logic" may include a unit implemented in hardware, software, or firmware, and may be interchangeably used with other terms, for example, "logic block," "part," or "circuitry". A module may be a single integral component, or a minimum unit or part thereof, adapted to perform one or more functions. For example, according to an embodiment of the disclosure, the SAR logic 160 may be implemented in a form of an application-specific integrated circuit (ASIC).

The analog-to-digital converter according to the embodiments may be applied to various electronic apparatuses.

Although the analog-to-digital converter, the method of analog-to-digital conversion, and the electronic apparatus according to the embodiments have been described with reference to the drawings, the illustrated embodiments are examples, and may be modified and changed by a person having ordinary knowledge in the relevant technical field without departing from the technical spirit described in the following claims.

What is claimed is:

1. An analog-to-digital converter, comprising:
a sample/hold circuit, which samples an analog signal, and outputs a first voltage;
a digital-to-analog conversion circuit, which converts a digital signal to output a second voltage;
an amplifier, which amplifies the first voltage and the second voltage;
a noise shaping filter, which integrates a residual voltage corresponding to a difference between the amplified first voltage and the amplified second voltage, and generates a first integration voltage and a second integration voltage;
a comparator, which compares a sum of the amplified first voltage, the first integration voltage, and the second integration voltage with the amplified second voltage; and
a successive approximation register ("SAR") logic, which outputs the digital signal according to a comparison result of the comparator, and controls the digital-to-analog conversion circuit.

2. The analog-to-digital converter of claim 1, wherein the amplifier is positioned at front ends of the noise shaping filter and the comparator, and positioned at back ends of the sample/hold circuit and the digital-to-analog conversion circuit.

3. The analog-to-digital converter of claim 1, wherein the amplifier is a pre-amplifier having a gain greater than 1.

4. The analog-to-digital converter of claim 1, wherein the amplifier is a buffer having a unit gain.

5. The analog-to-digital converter of claim 1, wherein the sample/hold circuit is a passive correlated double sampling ("CDS") circuit including a capacitor and a switch.

6. The analog-to-digital converter of claim 1, wherein the noise shaping filter is a passive filter including a capacitor and a switch.

7. The analog-to-digital converter of claim 6, wherein the capacitor of the noise shaping filter includes:
a residual capacitor, which samples the residual voltage;
a first integration capacitor, which stores the first integration voltage generated by charge sharing with the residual capacitor based on the residual voltage; and
a second integration capacitor, which stores the second integration voltage generated by charge sharing with the residual capacitor based on the first integration voltage.

8. The analog-to-digital converter of claim 7, wherein each of a capacitance of the residual capacitor, a capacitance of the first integration capacitor, and a capacitance of the second integration capacitor is less than a capacitance of a capacitor included in the digital-to-analog conversion circuit.

9. The analog-to-digital converter of claim 7, wherein a capacitance of the residual capacitor is less than each of a capacitance of the first integration capacitor and a capacitance of the second integration capacitor.

10. The analog-to-digital converter of claim 7, wherein a capacitance of the first integration capacitor is substantially equal to a capacitance of the second integration capacitor.

11. The analog-to-digital converter of claim 1, wherein the comparator amplifies the first integration voltage and the second integration voltage, and
wherein a gain with respect to the second integration voltage is greater than a gain with respect to the first integration voltage in the comparator.

12. A method of analog-to-digital conversion, the method comprising:
outputting a first voltage by sampling an analog signal;
outputting a second voltage by converting a digital signal;
amplifying the first voltage and the second voltage;
comparing a sum of the amplified first voltage, a first integration voltage, and a second integration voltage with the amplified second voltage;
outputting the digital signal according to a comparison result; and
generating the first integration voltage and the second integration voltage by integrating a residual voltage corresponding to a difference between the amplified first voltage and the amplified second voltage.

13. The method of claim 12, wherein outputting the second voltage, amplifying the first voltage and the second voltage, comparing the sum of the amplified first voltage, the first integration voltage, and the second integration voltage with the amplified second voltage, and outputting the digital signal are performed a plurality of times after outputting the first voltage and before generating the first integration voltage and the second integration voltage.

14. The method of claim 12, wherein generating the first integration voltage and the second integration voltage includes:
sampling the residual voltage;
storing the first integration voltage generated by charge sharing based on the residual voltage; and
storing the second integration voltage generated by charge sharing based on the first integration voltage.

15. The method of claim 14, wherein storing the second integration voltage is performed after storing the first integration voltage.

16. The method of claim 12, wherein comparing the sum of the amplified first voltage, the first integration voltage, and the second integration voltage with the amplified second voltage includes amplifying the first integration voltage and the second integration voltage, and
wherein a gain with respect to the second integration voltage is greater than a gain with respect to the first integration voltage.

17. An electronic apparatus, comprising:
a display device, which displays an image; and a sensor, which senses an external input to the display device, and includes an analog-to-digital converter, wherein the analog-to-digital converter includes:

a sample/hold circuit, which samples an analog signal generated by the external input, and outputs a first voltage;

a digital-to-analog conversion circuit, which converts a digital signal to output a second voltage;

an amplifier, which amplifies the first voltage and the second voltage;

a noise shaping filter, which integrates a residual voltage corresponding to a difference between the amplified first voltage and the amplified second voltage, and generates a first integration voltage and a second integration voltage;

a comparator, which compares a sum of the amplified first voltage, the first integration voltage, and the second integration voltage with the amplified second voltage; and a SAR logic, which outputs the digital signal according to a comparison result of the comparator, and controls the digital-to-analog conversion circuit.

18. The electronic apparatus of claim 17, wherein the sensor is at least one of an image sensor and a fingerprint sensor.

19. The electronic apparatus of claim 17, wherein the amplifier is positioned at front ends of the noise shaping filter and the comparator, and positioned at back ends of the sample/hold circuit and the digital-to-analog conversion circuit.

* * * * *